(12) United States Patent
Yan et al.

(10) Patent No.: US 9,190,516 B2
(45) Date of Patent: Nov. 17, 2015

(54) METHOD FOR A UNIFORM COMPRESSIVE STRAIN LAYER AND DEVICE THEREOF

(71) Applicant: GLOBALFOUNDRIES Inc., Grand Cayman (KY)

(72) Inventors: Ran Yan, Dresden (DE); Stefan Flachowsky, Dresden (DE); Alban Zaka, Dresden (DE); Jan Hoentschel, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 31 days.

(21) Appl. No.: 14/186,387

(22) Filed: Feb. 21, 2014

(65) Prior Publication Data

US 2015/0243787 A1 Aug. 27, 2015

(51) Int. Cl.
| | |
|---|---|
| *H01L 29/78* | (2006.01) |
| *H01L 29/161* | (2006.01) |
| *H01L 29/08* | (2006.01) |
| *H01L 29/66* | (2006.01) |
| *H01L 21/02* | (2006.01) |
| *H01L 21/265* | (2006.01) |
| *H01L 21/3065* | (2006.01) |
| *H01L 29/167* | (2006.01) |
| *H01L 29/417* | (2006.01) |
| *H01L 21/8234* | (2006.01) |

(52) U.S. Cl.
CPC ...... *H01L 29/7848* (2013.01); *H01L 21/02532* (2013.01); *H01L 21/26513* (2013.01); *H01L 21/3065* (2013.01); *H01L 21/823418* (2013.01); *H01L 29/0843* (2013.01); *H01L 29/0847* (2013.01); *H01L 29/161* (2013.01); *H01L 29/167* (2013.01); *H01L 29/41725* (2013.01); *H01L 29/66477* (2013.01); *H01L 29/66636* (2013.01)

(58) Field of Classification Search
CPC ................. H01L 29/66636; H01L 21/823418; H01L 29/0843; H01L 29/41725; H01L 29/7848
See application file for complete search history.

(56) References Cited

U.S. PATENT DOCUMENTS

| | | | | |
|---|---|---|---|---|
| 2007/0298557 | A1* | 12/2007 | Nieh et al. | 438/197 |
| 2010/0025743 | A1* | 2/2010 | Hoentschel et al. | 257/288 |
| 2010/0197092 | A1* | 8/2010 | Kim et al. | 438/229 |
| 2011/0042729 | A1* | 2/2011 | Chen et al. | 257/288 |
| 2011/0049582 | A1* | 3/2011 | Johnson et al. | 257/288 |
| 2011/0309447 | A1* | 12/2011 | Arghavani et al. | 257/368 |
| 2013/0026582 | A1* | 1/2013 | Javorka et al. | 257/413 |
| 2013/0075830 | A1* | 3/2013 | Miyano et al. | 257/408 |

* cited by examiner

*Primary Examiner* — Joseph C Nicely
(74) *Attorney, Agent, or Firm* — Ditthavong & Steiner, P.C.

(57) ABSTRACT

A methodology for forming a compressive strain layer with increased thickness that exhibits improved device performance and the resulting device are disclosed. Embodiments may include forming a recess in a source or drain region of a substrate, implanting a high-dose impurity in a surface of the recess, and depositing a silicon-germanium (SiGe) layer in the recess.

14 Claims, 4 Drawing Sheets

METHOD FOR A UNIFORM COMPRESSIVE STRAIN LAYER AND DEVICE THEREOF

TECHNICAL FIELD

The present disclosure relates to fabrication of semiconductor devices with strain-engineered channel regions. More particularly, the present disclosure relates to strain engineering for semiconductor devices at the 28 nanometer (nm) technology node and beyond.

BACKGROUND

Embedded silicon germanium (eSiGe) is commonly used to introduce stress in the channel regions of, for example, PMOS devices to improve hole mobility and, therefore, device performance. The eSiGe is typically formed in a recess in the silicon substrate adjacent the channel region. However, during a typical SiGe deposition, the SiGe grows at a faster rate at bottom surfaces than sidewall surfaces of recesses. This results in an eSiGe layer of non-uniform thickness, particularly at the edges of the recess where the deposited SiGe tapers. The non-uniform thickness impairs efforts to engineer channel region strain and impacts the performance of the resulting device.

A need therefore exists for methodology enabling the adjustment of the relative growth rate of strain-inducing materials at the bottom and sidewall surfaces of recesses and the resulting devices.

SUMMARY

An aspect of the present disclosure is a method for forming a compressive strain layer of a uniform thickness.

Another aspect of the present disclosure is a device with a high-dose impurity implanted in a surface of a recess used to form a compressive strain layer of a uniform thickness.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a recess in a source or drain region of a substrate, implanting a high-dose impurity in a surface of the recess, and depositing a SiGe layer in the recess.

Aspects of the present disclosure include implanting the high-dose impurity at a concentration of 1e14 atoms/cm$^2$ to 1e15 atoms/cm$^2$. Further aspects include implanting the high-dose impurity along an axis perpendicular to a bottom surface of the recess, or implanting the high-dose impurity at an angle between 0 and 90 degrees to a side surface of the recess. Additional aspects include implanting fluorine (F), nitrogen (N), neon (Ne), argon (Ar), or a combination thereof, in a bottom surface of the recess, or implanting germanium (Ge) in a side surface of the recess. Further aspects include adjusting a thickness of the SiGe layer based on a concentration of the high-dose impurity. Additional aspects include implanting a first high-dose impurity in a bottom surface of the recess and implanting a second high-dose impurity in a sidewall surface of the recess. Further aspects include the first high-dose impurity including F, N, Ne, Ar, or a combination thereof, and the second high-dose impurity including Ge. Additional aspects include differentially adjusting respective concentrations of the first and second high-dose impurities to obtain a SiGe layer of substantially uniform thickness. Further aspects include forming the recess by a dry etch process.

Another aspect of the present disclosure is a device including a substrate, a source or drain region in the substrate, a recess in the source or drain region, a high-dose impurity implanted in a surface of the recess, and a SiGe layer formed in the recess.

Aspects include the high-dose impurity being implanted along an axis perpendicular to a bottom surface of the recess, or the high-dose impurity being planted at an angle between 0 and 90 degrees to a side surface of the recess. Further aspects include the high-dose impurity being implanted in a bottom surface of the recess and including F, N, Ne, Ar, or a combination thereof. Additional aspects include the high-dose impurity being implanted in a side surface of the recess and including Ge. Further aspects include a thickness of the SiGe layer being based on a concentration of the high-dose impurity. Additional aspects include the concentration of the high-dose impurity ranging from 1e14 atoms/cm$^2$ to 1e15 atoms/cm$^2$. Further aspects include the first high-dose impurity being implanted in a bottom surface of the recess, and a second high-dose impurity implanted in a sidewall surface of the recess. Additional aspects include the first high-dose impurity including F, N, Ne, Ar, or a combination thereof, and the second high-dose impurity including Ge. Further aspects include the respective concentrations of the first and second high-dose impurities corresponding to a SiGe layer of substantially uniform thickness.

Other aspects of the present disclosure include a method including forming a recess in a source or drain region of a substrate, implanting an impurity in a surface of the recess at a concentration of 1e14 atoms/cm$^2$ to 1e15 atoms/cm$^2$ along an axis perpendicular to a bottom surface of the recess or at an angle between 0 and 90 degrees to a side surface of the recess, epitaxially growing a SiGe layer in the recess, and adjusting a thickness of the SiGe layer based on the concentration of the impurity. Further aspects include implanting a first impurity including F, N, Ne, Ar, or a combination thereof, to a bottom surface of the recess, implanting a second impurity including Ge to a sidewall surface of the recess, and differentially adjusting respective concentrations of the first and second impurities to obtain a SiGe layer of substantially uniform thickness.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of uneven growth attendant upon forming compressive stress layers in recesses in a substrate. In accordance with embodiments of the present disclosure, a surface of the recess used to form the compressive stress layer is doped with a high-dose impurity prior to growing the stress layer.

Methodology in accordance with embodiments of the present disclosure includes forming a recess in a source or drain region of a substrate, implanting a high-dose impurity in a surface of the recess, and depositing a SiGe layer in the recess.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
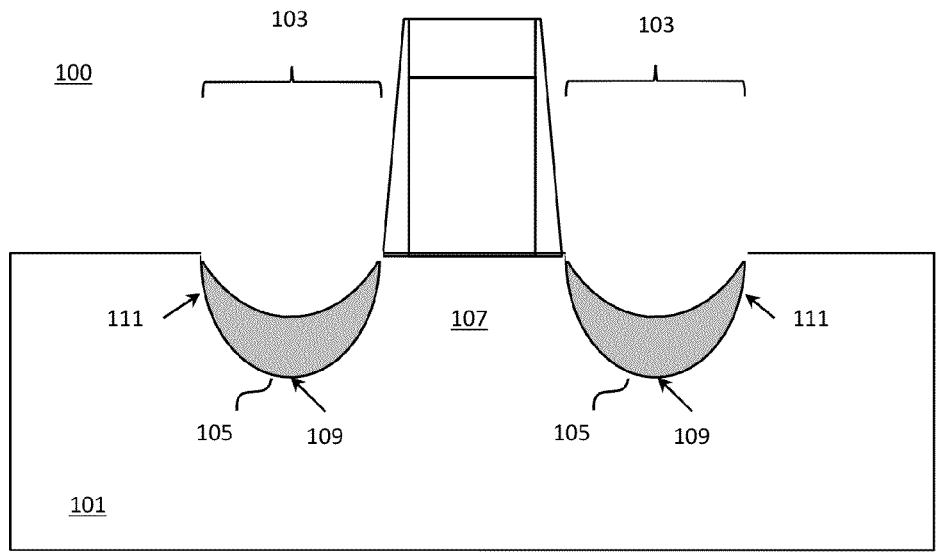
FIG. 1A illustrates a cross-section view of a conventional transistor with an embedded compressive strain layer.

FIG. 1A illustrates a cross-section view of a conventional transistor with an embedded strain-inducing layer. The transistor 100 is formed on a substrate 101 with source and drain regions 103. The substrate 101 may, for instance, be formed from Si. As shown, the strain-inducing layer 105 (e.g., SiGe) is embedded in each of the source and drain regions 103. The geometry of the strain-inducing layer 105 induces a large, uniaxial, strain in the channel region 107, which results in significant improvement in hole mobility. The strain-inducing layer 105 may be deposited by an epitaxial growth process in recesses etched into the source and drain regions 103. However, the growth rate may be different along different surfaces of the recesses. For instance, the thickness of the strain-inducing layer 105 is greatest at the bottom surfaces 109 and then tapers at the edges 111.

Figure 1B:
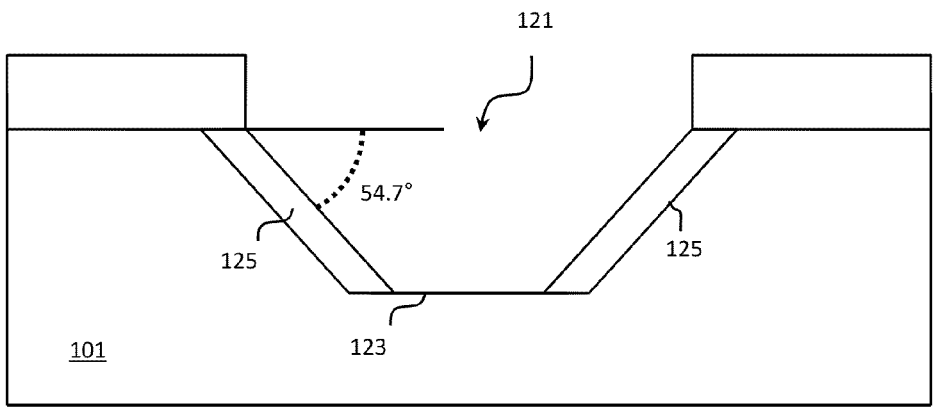
FIG. 1B illustrates surfaces of a recess used to form an embedded compressive strain layer.

FIG. 1B schematically illustrates a recess 121 formed in the substrate 101. A strain-inducing layer (e.g., SiGe) typically grows at a faster rate at the bottom surface 123 that corresponds to a <100> crystal direction of the substrate 101 than at the sidewall surfaces 125 that correspond to the <110> and <111> directions. As indicated, the <110> and <111> directions may roughly correspond to a surface angle of 54.7 degrees.

FIGS. 2A through 2E schematically illustrate a process for forming a uniform, embedded strain-inducing layer, according to an exemplary embodiment of the present disclosure.

Figure 2A:
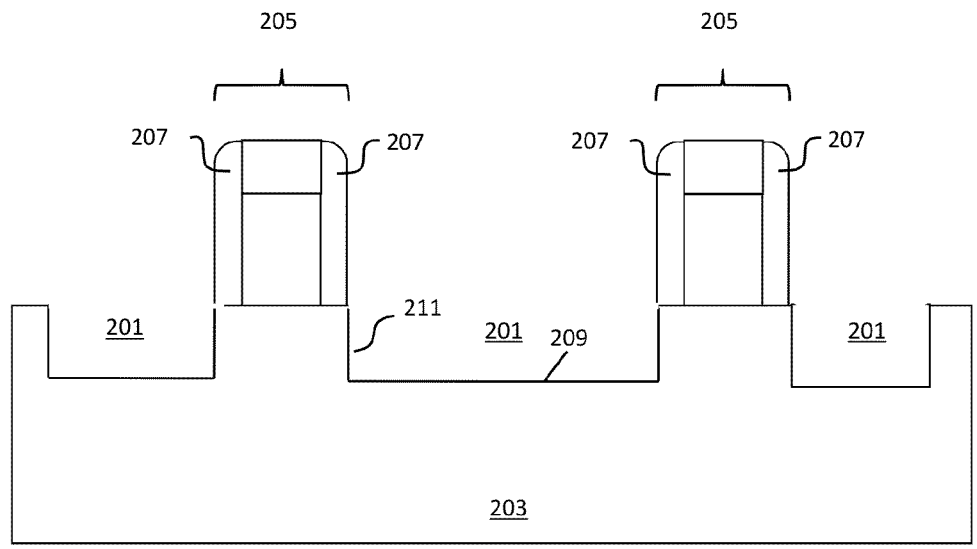
FIGS. 2A through 2E schematically illustrate a process for forming a uniform, embedded compressive strain layer, according to an exemplary embodiment of the present disclosure.

Adverting to FIG. 2A, recesses 201 are formed in the source and drain regions of the substrate 203 on opposite sides of each gate 205. The U-shaped recesses 201 may be formed after the spacers 207 have been formed. The U-shaped recesses 201 may be formed by a wet or dry etch process. Surfaces of the recesses 201 may correspond to various crystal directions of the underlying substrate 203. For instance, the bottom surfaces (e.g., surface 209) may correspond to a <100> face of a Si substrate and the sidewall surfaces (e.g., surface 211) may correspond to a <110> or <111> face of a Si substrate, though illustrated as perpendicular to the bottom surface.

Figure 2B:
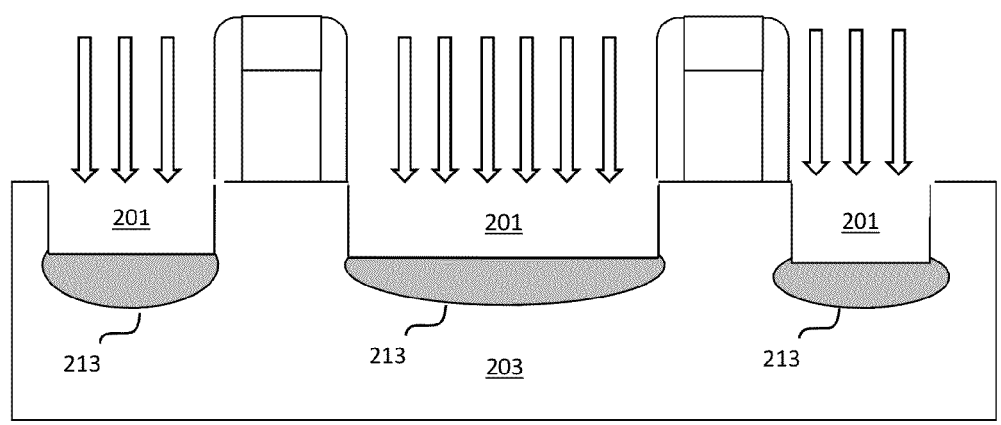
Figure 2C:
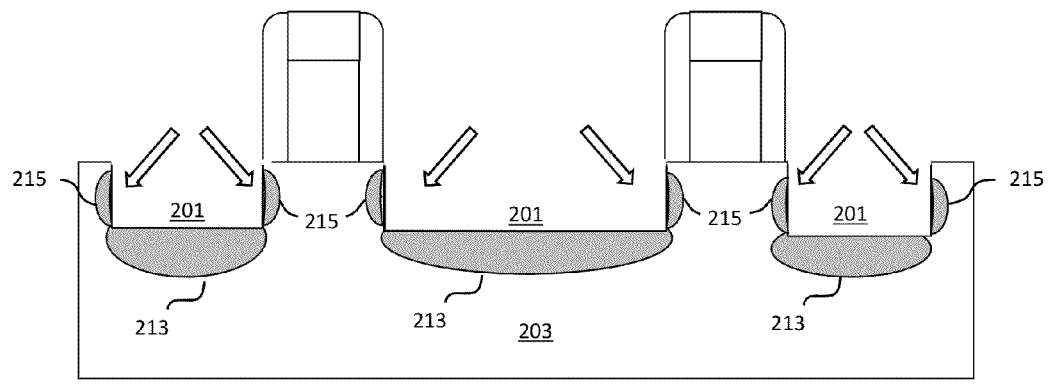

Adverting to FIG. 2B, the bottom surfaces of the recesses 201 are implanted with a high-dose impurity to form the implanted impurity regions 213. The implanted impurity regions 213 may include, for instance, F, N, Ne, or Ar. A standard metal implantation process may be used. Adverting to FIG. 2C, the sidewall surfaces of the recesses 201 are implanted with a tilted high-dose impurity to form the implanted impurity regions 215. The implanted impurity regions 215 may include, for instance, Ge. A standard metal implant process may be used. The bottom and sidewall surface implants may be performed separately or in a single implantation step. Alternatively, either implanted impurity regions 213 or implanted impurity regions 215 may be used alone (not shown for illustrative convenience). In accordance with this disclosure, "high-dose" is defined as a concentration of the impurity ranging from 1e14 atoms/$cm^2$ to 1e15 atoms/$cm^2$.

Figure 2D:
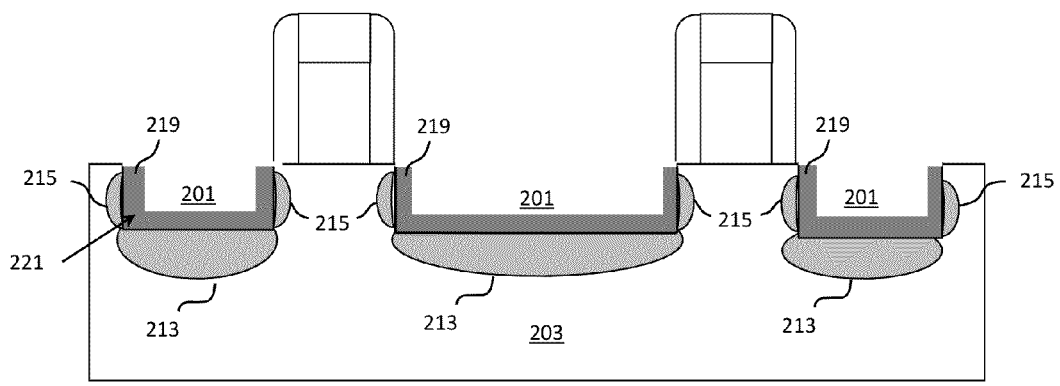
Figure 2E:
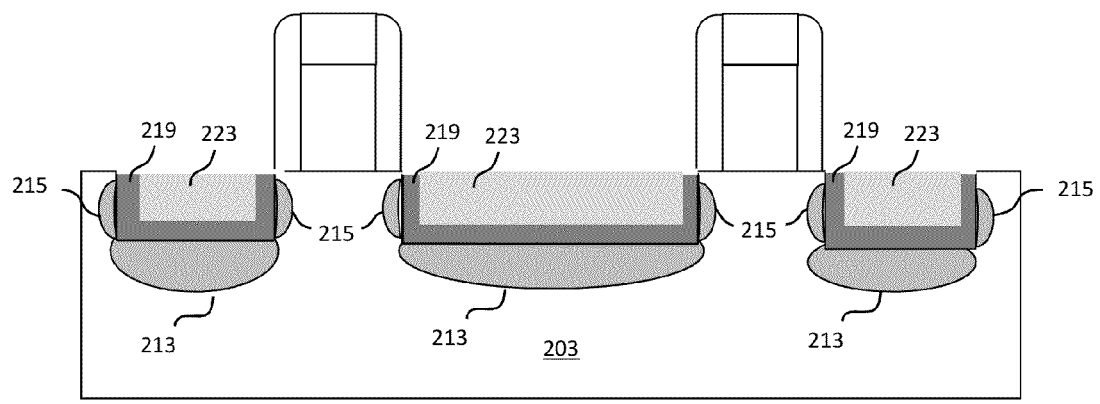

Adverting to FIG. 2D, a strain-inducing layer 219 (e.g., SiGe) is deposited in the recesses 201. Prior to the deposition, a surface cleaning process (e.g., plasma clean and anneal treatment) may be used to clean the surfaces of the doped substrate. The strain-inducing layer 219 may be formed by an epitaxial growth process. As shown, the final shape of the material is more uniform at all points along the recess, particular at the corners (e.g., corner 221) of the recesses 201. For instance, the thickness at the corner and sidewall surfaces of the recesses may be approximately the same as the thickness at the bottom surfaces of the recesses. Adverting to FIG. 2E, a cap 223 (e.g., Si) is formed to fill the recesses.

The final shape of the strain-inducing layer 219 may be adjusted by controlling the concentration of the implanted impurities. The bottom surface implants (e.g., F, N, Ne, or Ar) may downwardly adjust the growth rate whereas the sidewall implants (e.g., Ge) result in a higher growth rate. For instance, the bottom surface implants may retard the growth rate to make it slower than at the sidewall surfaces. By adjusting the relative concentration of the implants to the <100>, <110>, and <111> surfaces, the shape of the resulting strain-inducing layer 219 can be controlled to be more uniform.

The embodiments of the present disclosure can achieve several technical effects, including improved hole mobility and resulting device performance. The present disclosure enjoys industrial applicability in any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras. The present disclosure is particularly applicable to highly integrated 28 nm node and beyond semiconductor devices employing a compressive strain.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a recess in a source or drain region of a substrate;
    implanting a high-dose impurity along an axis perpendicular to a bottom surface of the recess; or implanting a high-dose impurity at an angle between 0 and 90 degrees to a side surface of the recess;
    depositing a silicon-germanium (SiGe) layer in the recess; and
    adjusting a thickness of the SiGe layer based on a concentration of the high-dose impurity,
    the high-dose impurity implanted at a concentration of 1e14 atoms/cm$^2$ to 1e15 atoms/cm$^2$.

2. The method of claim 1, comprising:
    implanting fluorine (F), nitrogen (N), neon (Ne), argon (Ar), or a combination thereof, in a bottom surface of the recess; or
    implanting germanium (Ge) in a side surface of the recess.

3. The method of claim 1, comprising:
    implanting a first high-dose impurity in a bottom surface of the recess; and
    implanting a second high-dose impurity in a sidewall surface of the recess.

4. The method of claim 3, wherein the first high-dose impurity comprises fluorine (F), nitrogen (N), neon (Ne), argon (Ar), or a combination thereof, and the second high-dose impurity comprises germanium (Ge).

5. The method of claim 3, comprising differentially adjusting respective concentrations of the first and second high-dose impurities to obtain a SiGe layer of substantially uniform thickness.

6. The method of claim 1, comprising forming the recess by a dry etch process.

7. A device comprising:
    a substrate;
    a source or drain region in the substrate;
    a recess in the source or drain region;
    a first high-dose impurity implanted in a bottom surface of the recess, and a second high-dose impurity implanted in a sidewall surface of the recess; and
    a silicon-germanium (SiGe) layer formed in the recess,
    wherein the first high-dose impurity comprises fluorine (F), nitrogen (N), neon (Ne), argon (Ar), or a combination thereof, and the second high-dose impurity comprises germanium (Ge).

8. The device of claim 7, wherein
    the high-dose impurity is implanted along an axis perpendicular to a bottom surface of the recess; or
    the high-dose impurity is implanted at an angle between 0 and 90 degrees to a side surface of the recess.

9. The method of claim 8 wherein:
    the high-dose impurity is implanted in a bottom surface of the recess and comprises fluorine (F), nitrogen (N), neon (Ne), argon (Ar), or a combination thereof.

10. The method of claim 8 wherein:
    the high-dose impurity is implanted in a side surface of the recess and comprises germanium (Ge).

11. The device of claim 8, wherein a thickness of the SiGe layer is based on a concentration of the high-dose impurity.

12. The device of claim 11, wherein the concentration of the high-dose impurity ranges from 1e14 atoms/cm$^2$ to 1e15 atoms/cm$^2$.

13. The device of claim 7, wherein respective concentrations of the first and second high-dose impurities correspond to a SiGe layer of substantially uniform thickness.

14. A method comprising:
    forming a recess in a source or drain region of a substrate;
    implanting a first impurity comprising fluorine (F), nitrogen (N), neon (Ne), argon (Ar), or a combination thereof, along an axis perpendicular to a bottom surface of the recess;
    implanting a second impurity comprising germanium (Ge) at an angle between 0 and 90 degrees to a sidewall surface of the recess;
    epitaxially growing a silicon-germanium (SiGe) layer in the recess; and
    differentially adjusting respective concentrations of the first and second impurities to obtain the SiGe layer of substantially uniform thickness,
    wherein the first and second impurities are implanted at a concentration of 1e14 atoms/cm$^2$ to 1e15 atoms/cm$^2$.

* * * * *